United States Patent
Lo et al.

(10) Patent No.: US 6,538,519 B2
(45) Date of Patent: Mar. 25, 2003

(54) PHASE-LOCKED LOOP CIRCUIT

(75) Inventors: Chi Wa Lo, Tuen Mun (HK); Howard Cam Luong, Clear Water Bay (HK)

(73) Assignee: The Hong Kong University of Science and Technology, Hong Kong (CN)

( * ) Notice: Subject to any disclaimer, the term of this patent is extended or adjusted under 35 U.S.C. 154(b) by 0 days.

(21) Appl. No.: 09/977,073

(22) Filed: Oct. 12, 2001

(65) Prior Publication Data

US 2002/0075091 A1 Jun. 20, 2002

Related U.S. Application Data

(60) Provisional application No. 60/240,618, filed on Oct. 12, 2000.

(51) Int. Cl.[7] .......... H03L 7/085; H03L 7/099; H03B 5/00
(52) U.S. Cl. .......... 331/17; 331/36 C; 331/175; 331/177 V
(58) Field of Search .......... 331/7, 18, 25, 331/36 C, 175, 177 V; 327/156–159; 375/376; 360/51; 332/127; 455/260

(56) References Cited

U.S. PATENT DOCUMENTS 5,384,502 A  1/1995 Volk .......... 327/157
5,821,818 A * 10/1998 Idei et al. .......... 331/17

OTHER PUBLICATIONS

Mijuskovic, et al., Cell–Based Fully Integrated CMOS Frequency Synthesizers, Mar., 1994, pp. 271–279, vol. 29, No. 3, IEEE Journal of Solid–State Circuits.

Craninckx, et al., A Fully Integrated CMOS DCS–1800 Frequency Synthesizer, Dec. 1998, pp. 2054–2065, vol. 33, No. 12, IEEE Journal of Solid–State Circuits.

* cited by examiner

*Primary Examiner*—David C. Mis
(74) *Attorney, Agent, or Firm*—Ostrolenk, Faber, Gerb & Soffen, LLP

(57) ABSTRACT

A phase locked loop wherein the voltage controlled oscillator is controlled by the output of a phase comparison circuit through a split loop filter. The oscillator has two varactors in parallel in its tuning circuit. The first branch of the loop filter includes an integrator filter generating a first error voltage and the second branch includes a low pass filter generating a second error voltage. The first error voltage controls one varactor and the second error voltage controls the other varactor. As a result the error voltages are effectively summed in the capacitance domain to obviate the need for a dedicated error voltage adder and to allow the total capacitance required in the loop filter to be reduced while still retaining an adequate signal to noise ratio in the filter.

4 Claims, 3 Drawing Sheets

PHASE-LOCKED LOOP CIRCUIT

CROSS-REFERENCE TO RELATED APPLICATION

This application claims priority of Provisional Patent Application No. 60/240,618, filed on Oct. 12, 2000.

FIELD OF THE INVENTION

This invention relates to phase-locked loop circuits and in particular phase-locked loop circuits with split loop filters.

PRIOR ART

Phase-locked loops (PLLs) which use feedback to maintain the frequency/phase of a signal in specific relationship with a reference signal are well known and commonly used in frequency synthesizers along with other applications. Frequency synthesizers are commonly used in radio receivers and transmitters to accurately generate a signal of any given frequency within a range of frequencies. A large volume application of frequency synthesizers at the date of this application is as local oscillators in cellphones.

The basic components of a phase-locked loop are shown in FIG. 1 where a voltage controlled oscillator (VCO) 1 produces the desired output signal $v_o$. This output signal is fed to a phase detector 2 through an integer divider 3 (which in use is used to select the output frequency). The second input of the phase detector 2 is a reference frequency signal $v_{ref}$ and any difference in frequency between the output frequency and the reference frequency manifests as a phase difference and generates an error signal at the output of phase detector 2. The error signal controls the frequency of VCO 1 by controlling the capacitance of a varactor in the oscillator tuning circuit, but to ensure the feedback loop so formed is stable, the error signal is passed through a loop filter 4. The loop filter 4 shapes the frequency response of the PLL in accordance with traditional control system theory.

PLLs are implemented using large scale integrated circuits and it is highly desirable for all components of the PLL to be implemented in a single chip.

In wireless applications, phase-locked loop frequency synthesizers require very good phase noise performance in order to obtain a good signal-to-noise ratio for the desired signals even in the presence of very large nearby unwanted signals. Inside the frequency synthesizer, the thermal noise generated by the charge pump and by the resistors in the loop filter will modulate the voltage-controlled oscillator 2 and degrade the phase noise performance. In order to reduce the thermal noise, the loop filter requires high value capacitors that are too large to be put on the chip. As a result, off-chip capacitors need to be used and thus the product size and cost are inevitably increased.

In U.S. Pat. No. 5,384,502 a split loop filter (also referred to as dual-loop filter) has been proposed as an effective solution to reduce the size of these capacitors, in which one branch of the loop filter includes an integrator, the other branch a low-pass filter, and a voltage adder is employed to combine the signals from the two branches to form the error signal which controls the VCO. However, this solution has the disadvantage of requiring a low-noise wide-dynamic-range voltage adder. This either contributes excess noise or consumes excess power and chip area.

SUMMARY OF THE INVENTION

It is an object of the present invention to provide a phase-locked filter having a split loop filter which does not require a low-noise wide-dynamic-range voltage adder.

It is a further object of the present invention to provide a phase-locked loop employing a split loop filter which allows the value of the filter capacitors to be minimized.

The invention consists in a phase-locked loop wherein the signal of a voltage controlled oscillator frequency is locked to a reference signal, and wherein said oscillator frequency is controlled by the output of a phase comparison circuit through a split loop filter including an integrator filter generating a first error voltage with respect to the reference and oscillator signals, and a low pass filter generating a second error voltage with respect to the reference and oscillator signals. The improvement comprises providing at least two varactors in parallel to control the frequency of said voltage controlled oscillator, and connecting the first error voltage to at least one varactor and the second error voltage to the remaining varactor.

In this invention the split loop filter is modified such that the output of the integrator and that of the low-pass filter are used to separately control two parallel varactors. As a result, the summing is inherently done in the capacitance domain, and a voltage adder is not needed. Moreover, the two paths in the loop filter become completely separated and can be independently optimized.

DETAILED DESCRIPTION OF THE PREFERRED EMBODIMENT

Figure 1:
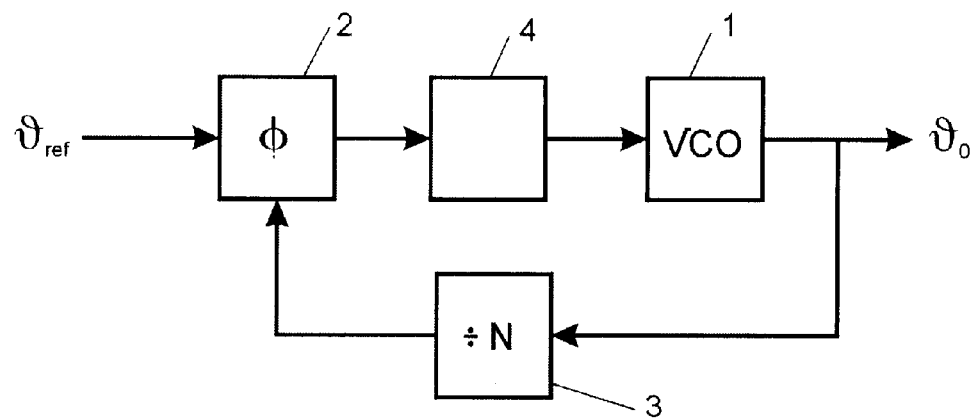
FIG. 1 shows the essential components of a phase-locked loop in block form.
Figure 2:
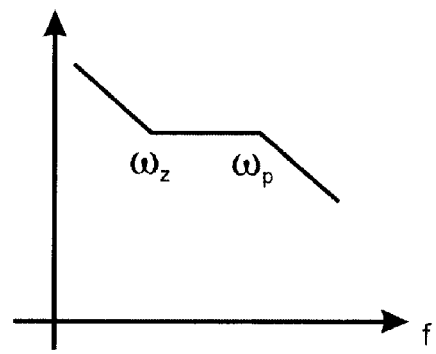
FIG. 2 shows a Bode plot of the desired transfer function of a typical loop filter in a frequency synthesizer.

The desired transfer function (in the frequency domain) for a PLL loop filter in a common Type-2 frequency synthesizer is shown in FIG. 2. An integrator is used in the loop filter in order to have a zero steady-state error, and a zero ($\omega_z$) is required in the transfer function of the loop filter in order to maintain stability. A pole ($\omega_p$) is also needed to reduce the ripple and noise in the high frequency.

Figure 3:
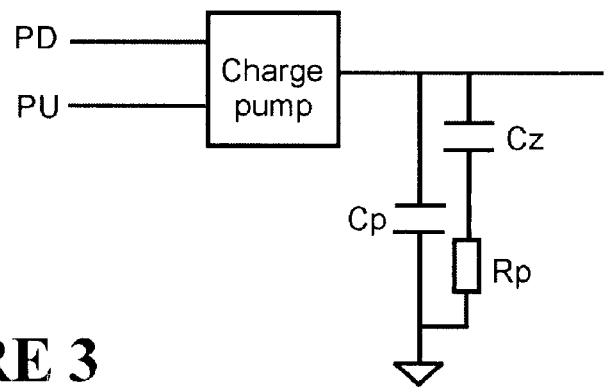
FIG. 3 shows a schematic diagram of a typical loop filter in a frequency synthesizer.

A typical circuit implementation for such a loop filter transfer function is shown in FIG. 3. The frequency of the zero ($\omega_z$) is $1/R_p C_z$ and the frequency of the pole ($\omega_p$) is $1/R_p C_p$. Since the frequency of the pole needs to be much higher than the frequency of the zero in order to maintain the loop stability, $C_z$ is inevitably much larger than $C_p$. Moreover, the size of $C_p$ is itself typically very large (in the order of few hundred pF) and has to be put off-chip.

Figure 4:
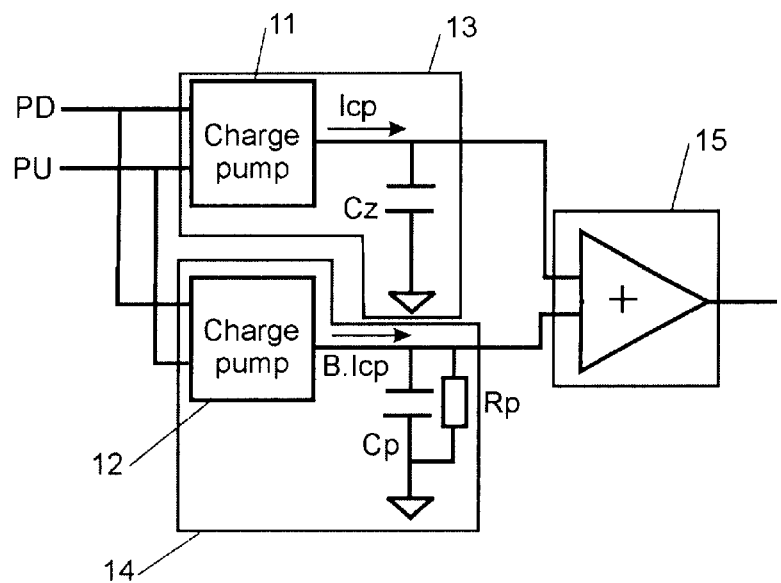
FIG. 4 shows a schematic diagram of a split loop filter (prior art)

The split loop filter 10 proposed in U.S. Pat. No. 5,384,502 is shown in FIG. 4. Two weighted charge pumps 11 and 12 are used to implement an integrator and a low-pass filter respectively. They are each driven by a corresponding pump up (PU) and pump down (PD) output of the phase detector. The upper charge pump 11 with a smaller output current $I_{cp}$ and a capacitor $C_z$ form the integrator 13 with the transfer function as shown in FIG. 5(a). The lower charge pump 12 has a much larger output current ($B \times I_{cp}$), and together with a capacitor $C_p$ and a resistor $R_p$ forms a low-pass filter 14 with the transfer function that is shown in FIG. 5(b). The outputs of the integrator 13 and the low-pass filter 14 are added by a voltage adder 15 to realise the required transfer function shown in FIG. 5(c).

Although no zero is implemented by either of the integrator or the low-pass filter, the crossing between the two transfer functions of the integrator and the low-pass filter actually creates the required zero. The two capacitors $C_z$ and $C_p$ in the two paths become independent and can be separately optimized. Minimum sizes of the two capacitors can be used as long as they can provide low enough phase noise performance.

Figure 5:
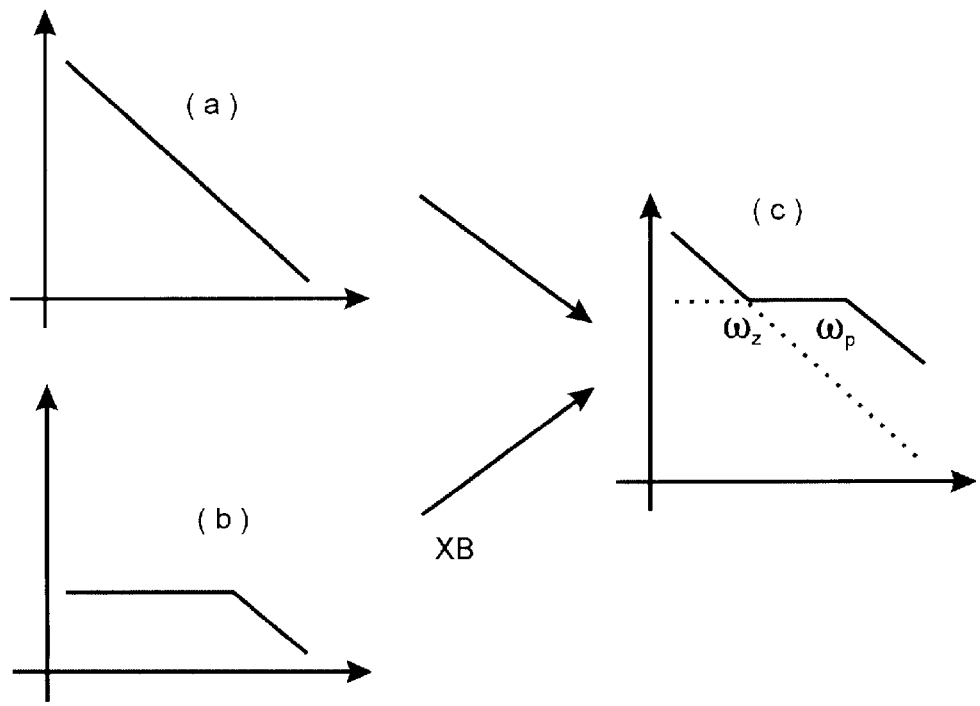
FIG. 5a shows the transfer function of the integrator in the split loop filter.
FIG. 5b shows the transfer function of the low pass filter in the split loop filter.
FIG. 5c shows the composite transfer function of the loop filter.
Figure 6:
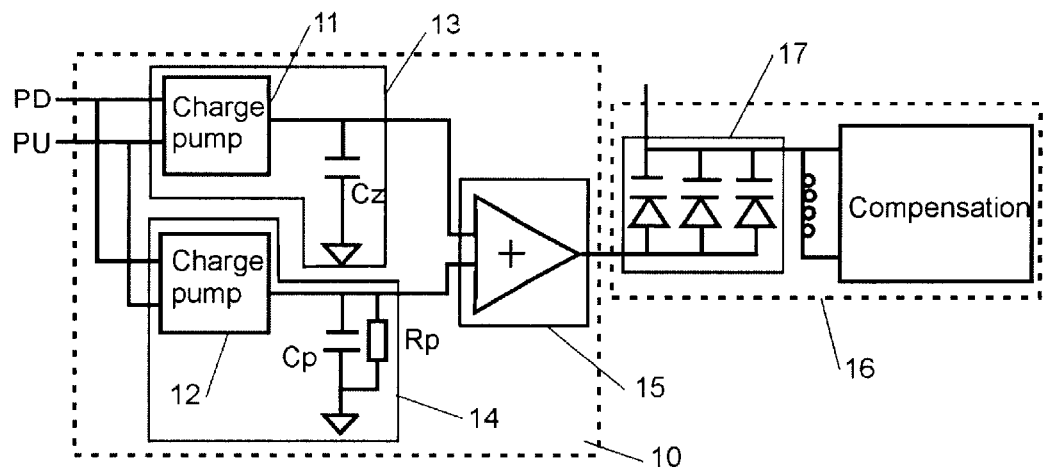
FIG. 6 shows a prior art split loop filter and voltage controlled oscillator in a phase-locked loop.
Figure 7:
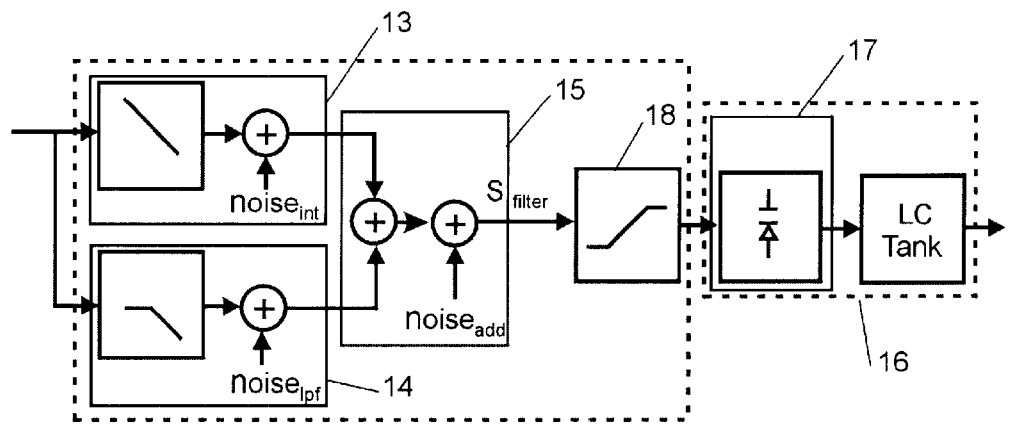
FIG. 7 shows a system representation of the circuit in FIG. 6.

FIG. 6 shows the schematic diagram of the split loop filter 10 of FIG. 5 connected to a voltage-controlled oscillator 16. The output of the split loop filter 10 is used to control a varactor 17 which forms part of the tuning circuit of the voltage-controlled oscillator 16. For practical reasons these varactors are connected in parallel in the example shown. The system representation of the circuit in FIG. 6 is shown in FIG. 7. The charge pumps, the integrator 13 and low-pass filter 14 and the resistor $R_p$ in the low pass filter generate thermal noise ($n_{int}$ and $n_{lpf}$). Moreover, the voltage adder 15 used to add the output signals from the integrator and the low-pass filter will also generate thermal noise ($n_{add}$). The resultant noise will modulate the voltage-controlled oscillator 16 and degrade the overall phase noise performance of the phase-locked loop.

One way to reduce the effect of the noise contribution is to use large value capacitors for $C_z$ and $C_p$, but this is undesirable for size and cost. A more effective way is to increase the signal magnitude of the filter output ($S_{filter}$) to achieve a larger signal-to-noise ratio $S_{filter}/n_{int}+n_{lpf}+n_{adder}$. This can be done by increasing the gain of the filter. However, the maximum signal magnitude of the filter output ($S_{filter}$) is then limited by the supply voltage. In addition, in order to keep the same loop gain, the gain of the voltage-controlled oscillator 16 has to be reduced by using a smaller varactor 17. Both the limited signal range at the filter output and the small gain of the voltage-controlled oscillator will inevitably and severely limit the overall tuning range of the system. In FIG. 7 the output of the voltage adder ($S_{filter}$) is limited by the supply voltage and would degrade the system performance in terms of the tuning range.

Figure 8:
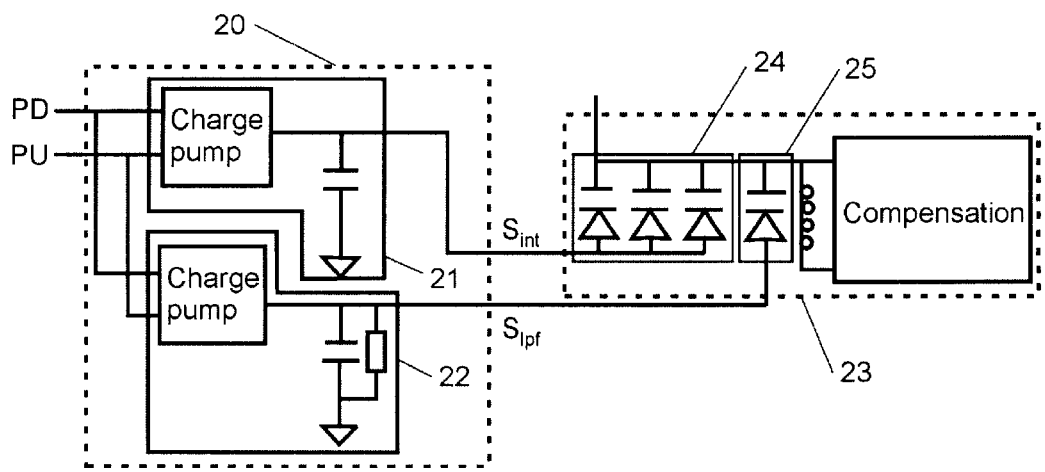
FIG. 8 shows a split loop filter and a voltage controlled oscillator for a phase-locked loop in accordance with the present invention.

In the present invention the prior art split loop filter (FIG. 6) is modified as shown in FIG. 8 such that each output of the integrator 21 and the low-pass filter 22 are used to separately and directly control two separate varactors 24 and 25 in the voltage-controlled oscillator 23. For this purpose two separately controlled varactors are provided in parallel to control the frequency of the VCO tuning circuit. Instead of using a separate voltage adder to add the two output voltages of the integrator and the low-pass filter, the capacitances of the two varactors controlled by the integrator and the low-pass filter respectively are inherently added by just being connected in parallel. As such, the addition function is performed inherently in the capacitance domain instead of in the voltage domain, and the need for a low-noise and wide-dynamic-range voltage adder is completely eliminated. In practice the required capacitance of varactor 24 is made up using a combination of three varactors in parallel.

Comparison with FIG. 7 shows the voltage adder and its associated noise sources are completely removed. Moreover, the addition of the signals is done after the varactors. Instead of sharing a common varactor 17, the two signal paths include their own varactors 24,25.

When the phase-locked loop is in lock, there are no net currents flowing into the integrator 21 and low-pass filter 22. The low-pass filter 22 has a zero DC output voltage $S_{lpf}$ and thus does not provide any tuning capability for the voltage-controlled oscillator. Since there is always a zero DC voltage, the low pass filter output is not limited by the supply voltage and thus does not affect the system performance. In this case, the effect of the thermal noise $n_{lpf}$ of the low-pass filter 22 can be reduced by increasing its output signal magnitude $S_{lpf}$. At the same time, the size of varactor 25 can be much reduced. As a result, a much smaller capacitor in the low-pass filter 22 can be used. Since the paths of the integrator 21 and the low-pass filter 22 are separated, the signal magnitude $S_{int}$ of the integrator 21 can be kept the same so as not to sacrifice the tuning capability.

As a summary, the advantages of the proposed design include:

(1) The proposed circuitry is much simpler and performs much better than the prior art not only in terms of lower noise and a lower supply voltage requirement but also in terms of lower power consumption because a voltage adder—which would inevitably contribute a lot of noise, require a large dynamic range, and consume excess power—is not needed.

(2) The total capacitance and the total chip area can be reduced by around half while maintaining the same tuning range for the synthesizer. This is because a large signal magnitude in the low-pass filter path can be used for maximising the signal-to-noise ratio whereas a small signal magnitude in the integrator path can be used to provide the desired tuning range.

We claim:

1. In a phase-locked loop wherein the signal of a voltage controlled oscillator is locked to a reference signal, and wherein said oscillator frequency is controlled by the output of a phase comparison circuit through a split loop filter, said filter including in one branch an integrator filter generating a first error voltage with respect to the reference and oscillator signals, and including in the second branch a low pass filter generating a second error voltage with respect to the reference and oscillator signals, the improvement comprising:

first and second varactor elements connected in parallel in the tuning circuit of said voltage controlled oscillator to control the frequency of said oscillator, said first varactor element connected to the output of the integrator filter and said second varactor element connected to the output of the low pass filter.

2. A phase locked loop according to claim 1 implemented in a single substrate.

3. A phase locked loop according to claim 2 wherein the gain of the second branch of the split loop filter is high, the low pass filter has a capacitance element and wherein the sizes of the second varactor element and said capacitance element of said low pass filter are low to thereby reduce the required substrate area.

4. A phase locked loop according to claim 1 wherein said first varactor element comprises a plurality of varactors connected in parallel.

\* \* \* \* \*